United States Patent
Yamazaki et al.

(10) Patent No.: US 8,502,435 B2
(45) Date of Patent: Aug. 6, 2013

(54) PIEZOELECTRIC CERAMIC COMPOSITION AND PIEZOELECTRIC DEVICE

(75) Inventors: Masato Yamazaki, Komaki (JP); Kohei Ito, Komaki (JP); Katsuya Yamagiwa, Komaki (JP); Takeshi Mitsuoka, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 288 days.

(21) Appl. No.: 12/596,117

(22) PCT Filed: Apr. 17, 2008

(86) PCT No.: PCT/JP2008/057536
§ 371 (c)(1),
(2), (4) Date: Oct. 15, 2009

(87) PCT Pub. No.: WO2008/130011
PCT Pub. Date: Oct. 30, 2008

(65) Prior Publication Data
US 2010/0133959 A1 Jun. 3, 2010

(30) Foreign Application Priority Data
Apr. 19, 2007 (JP) ................................ 2007-110049

(51) Int. Cl.
*H01L 41/187* (2006.01)
(52) U.S. Cl.
USPC ................ 310/358; 252/62.9 R; 252/62.9 PZ

(58) Field of Classification Search
USPC ....................... 310/358; 252/62.9 R, 62.9 PZ
See application file for complete search history.

(56) References Cited

U.S. PATENT DOCUMENTS

| | | | |
|---|---|---|---|
| 5,945,030 | A | 8/1999 | Kimura et al. |
| 6,231,779 | B1 * | 5/2001 | Chiang et al. ............ 252/62.9 R |
| 6,437,488 | B1 * | 8/2002 | Sube et al. ................... 310/366 |
| 6,806,626 | B2 * | 10/2004 | Morinaga et al. ............ 310/366 |
| 2001/0015420 | A1 * | 8/2001 | Hirose et al. ............ 252/62.9 R |
| 2002/0036282 | A1 * | 3/2002 | Chiang et al. ............ 252/62.9 R |
| 2003/0067251 | A1 * | 4/2003 | Kashiwaya et al. .......... 310/358 |

FOREIGN PATENT DOCUMENTS
EP 1 124 267 A2 8/2001
(Continued)

OTHER PUBLICATIONS

Seiji Ikegami, et al., "Piezoelectricity in Ceramics of Ferroelectric Bismuth Compound with Layer Structure", Japanese Journal of Applied Physics, 1974, pp. 1572-1577, vol. 13, No. 2.

(Continued)

*Primary Examiner* — J. San Martin
*Assistant Examiner* — Bryan Gordon
(74) *Attorney, Agent, or Firm* — Sughrue Mion, PLLC

(57) ABSTRACT

There are provided a piezoelectric ceramic composition that includes a bismuth layer-structured compound, which contains Na, Bi, Co and Ln (lanthanoide), as a main component and a piezoelectric ceramic composition that includes a compound, which contains Na, Bi, Ti, Co and Ln (lanthanoide) and has a $Na_{0.5}Bi_{4.5}Ti_4O_{15}$ type crystal structure, as a main component, wherein the piezoelectric ceramic composition has an atomic ratio of $0<Ln/(Na+Bi+Ln)\leqq 0.04$.

4 Claims, 1 Drawing Sheet

FOREIGN PATENT DOCUMENTS

| | | |
|---|---|---|
| EP | 1 591 568 A1 | 11/2005 |
| EP | 1 598 871 A1 | 11/2005 |
| JP | 50-067492 A | 6/1975 |
| JP | 11-029356 A | 2/1999 |
| JP | 11-217262 A | 8/1999 |
| JP | 2001-220226 A | 8/2001 |
| JP | 2001-302343 A | 10/2001 |
| JP | 2003026474 A | 1/2003 |
| JP | 2004-077304 A | 3/2004 |
| JP | 2006-169032 A | 6/2006 |

OTHER PUBLICATIONS

Tadashi Takenaka, et al., "Grain-Oriented and Mn-Doped $(NaBi)_{(1-x)/2} Ca_x Bi_4 Ti_4 O_{15}$ Ceramics for Piezo- and Pyrosensor Materials", Sensors and Materials, 1988, pp. 35-46, vol. 1.

"Electrical Test Methods for Piezoelectric Ceramic Vibrators", EMAS-6100, published by Standard of Electronic Materials Manufacturers Association of Japan, pp. 1-103.

European Search Report for corresponding Application No. 08740598.1, issued Feb. 7, 2013.

* cited by examiner

PIEZOELECTRIC CERAMIC COMPOSITION AND PIEZOELECTRIC DEVICE

TECHNICAL FIELD

The present invention relates to a piezoelectric ceramic composition and a piezoelectric device using the same.

BACKGROUND ART

Most of piezoelectric ceramic materials currently in practical use contain lead as typified by lead titanate (PT) and lead zirconate titanate (PZT). The lead-containing piezoelectric ceramic materials however raise a concern about the environmental effects of their lead components. Further, the lead-containing piezoelectric ceramic materials have a Curie point (Curie temperature) of about 200 to 500° C. and lose their piezoelectric properties at temperatures higher than or equal to the Curie point so that it is difficult to use the lead-containing piezoelectric ceramic materials for piezoelectric ceramic sensors whose operating temperatures are generally 500° C. or higher. There is a need for lead-free piezoelectric ceramic usable at 500° C. or higher with less environmental effects and no loss of piezoelectric properties.

As such lead-free piezoelectric ceramic, bismuth layer-structured ferroelectric materials $Na_{0.5}Bi_{4.5}Ti_4O_{15}$ (NBT) are known. (See Patent Publications 1 and 2 and Non-Patent Publications 1 and 2.) The bismuth layer-structured ferroelectric materials NBT are expected as lead-free piezoelectric ceramic usable under high-temperature conditions due to the fact that the Curie point of the bismuth layer-structured ferroelectric materials NBT is about 670° C. and is higher than the Curie point of the PT and PZT materials.

Patent Publication 1: Japanese Laid-Open Patent Publication No. S50-67492
Patent Publication 2: Japanese Laid-Open Patent Publication No. H11-29356
Non-Patent Publication 1: "Piezoelectricity in Ceramics of Ferroelectric Bismuth Compound with Layer Structure", S. Ikegami and I. Ueda, Japanese Journal of Applied Physics, 13 (1974), p. 1572-1577
Non-Patent Publication 2: "Grain-Oriented and Mn-Doped $(NaBi)_{(1-x)}/2Ca_xBi_4Ti_4O_{15}$ Ceramics for Piezo- and Pyrosensor Materials", T. Takenaka and K. Sakata, Sensor and Materials, 1 (1988), p. 35-46

The bismuth layer-structured ferroelectric material $Na_{0.5}Bi_{4.5}Ti_4O_{15}$ (NBT) has a high Curie point and high heat resistance but a low piezoelectric distortion constant (d33) and low mechanical quality factor (Qm). It is difficult to use the bismuth layer-structured ferroelectric materials $Na_{0.5}Bi_{4.5}Ti_4O_{15}$ (NBT) for resonators and sensors as the resonators and sensors require a high piezoelectric distortion constant and high mechanical quality factor. Although it is known that the piezoelectric distortion constant of anisotropic crystal material like the bismuth layer-structured ferroelectric material NBT can be improved by orienting the material into a specific crystal direction, such a crystal orientation technique requires hot press treatment etc. so that the production process of the material becomes complicated to cause an increase in production cost.

DISCLOSURE OF THE INVENTION

The present invention has been made to solve the above problems. It is an object of the present invention to provide a piezoelectric ceramic composition that contains a bismuth layer-structured compound as a main component, shows good piezoelectric properties, notably a high piezoelectric distortion constant and high mechanical quality factor, and can be easily produced. It is also an object of the present invention to provide a piezoelectric device using the piezoelectric ceramic composition.

According to a first aspect of the present invention, there is provided a piezoelectric ceramic composition comprising a bismuth layer-structured compound, which contains Na, Bi, Co and Ln (lanthanoide) as a main component, wherein the piezoelectric ceramic composition has an atomic ratio of $0<Ln/(Na+Bi+Ln)\leq0.04$.

According to a second aspect of the present invention, there is provided a piezoelectric ceramic composition comprising a compound, which contains Na, Bi, Ti, Co and Ln (lanthanoide) and has a $Na_{0.5}Bi_{4.5}Ti_4O_{15}$ type crystal structure, as a main component, wherein the piezoelectric ceramic composition has an atomic ratio of $0<Ln/(Na+Bi+Ln)\leq0.04$.

It is preferable that the above piezoelectric ceramic compositions are substantially free of an element of group 2 of the periodic table. It is further preferable that the above piezoelectric ceramic compositions contain at least one of La, Ce, Pr, Nd and Yb as Ln.

According to another aspect of the present invention, there is provided a piezoelectric device comprising electrodes of different polarities arranged on either of the above piezoelectric ceramic compositions.

BEST MODE FOR CARRYING OUT THE INVENTION

Figure 1:
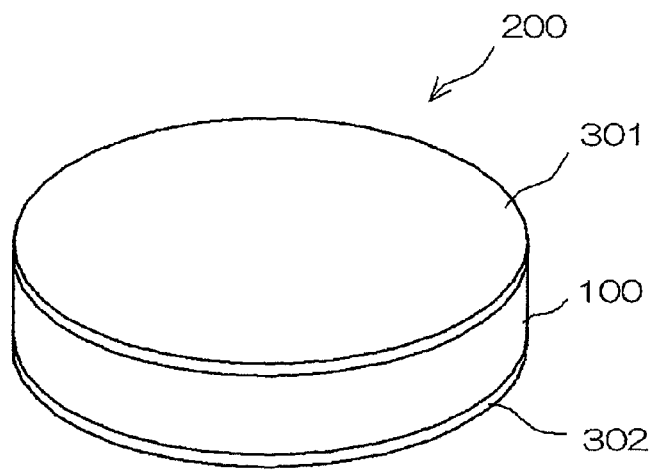
FIG. 1 is a perspective view of a piezoelectric device according to one embodiment of the present invention.

The present invention will be described in detail below.
The present invention provides piezoelectric ceramic compositions that contain a bismuth layer-structured compound (notably, a bismuth layer-structured ferroelectric compound $Na_{0.5}Bi_{4.5}Ti_4O_{15}$ (NBT)) as a main component and attain a high piezoelectric distortion constant and high mechanical quality factor by composition range control even with no crystal orientation.

More specifically, a piezoelectric ceramic composition according to a first embodiment of the present invention includes a bismuth layer-structured compound, which contains Na, Bi, Co and Ln (lanthanoide), as a main component and is characterized as having an atomic ratio of $0<Ln/(Na+Bi+Ln)\leq0.04$. By the addition of Co to the composition of the bismuth layer-structured compound containing Na and Bi, it is possible to prevent an impurity phase from occurring together with the bismuth layer-structured compound during the production of the piezoelectric ceramic composition and thereby increase the production rate of the bismuth layer-structured compound. It is also possible to generate a distortion in the crystal structure of the bismuth layer-structured compound and increase the piezoelectric distortion constant of the piezoelectric ceramic composition. It is further possible to increase the mechanical quality factor of the piezoelectric ceramic composition by the addition of Ln (lanthanoide). The reason for the increase in the mechanical quality factor of the piezoelectric ceramic composition is assumed to be that the coercive field of the piezoelectric ceramic composition decreases with the addition of Ln so as to allow sufficient polarization of the piezoelectric ceramic composition.

Further, a piezoelectric ceramic composition according to a second embodiment of the present invention includes a compound, which contains Na, Bi, Ti, Co and Ln (lanthanoide) and has a $Na_{0.5}Bi_{4.5}Ti_4O_{15}$ type crystal structure, as a main component and is characterized as having an atomic ratio of $0<Ln/(Na+Bi+Ln)\leq0.04$. By the addition of Co to the composition of the bismuth layer-structured ferroelectric NBT compound (the compound of $Na_{0.5}Bi_{4.5}Ti_4O_{15}$ type crystal structure), it is possible to prevent an impurity phase from occurring together with the NBT compound during the production of the piezoelectric ceramic composition and thereby increase the production rate of the NBT compound. It is also possible to generate a distortion in the crystal structure of the NBT compound and increase the piezoelectric distortion constant of the piezoelectric ceramic composition. It is further possible to increase the mechanical quality factor of the piezoelectric ceramic composition by the addition of Ln (lanthanoide). The reason for the increase in the mechanical quality factor of the piezoelectric ceramic composition is assumed to be that the coercive field of the piezoelectric ceramic composition decreases with the addition of Ln so as to allow sufficient polarization of the piezoelectric ceramic composition.

In the case of forming the piezoelectric ceramic composition only from the bismuth layer-structured ferroelectric NBT material with no Co element, there occurs an impurity phase of $Bi_4Ti_3O_{12}$ (BiT) together with the NBT material so as to cause decreases in the production rate of the NBT material and the piezoelectric distortion constant of the piezoelectric ceramic composition. In the case of forming the piezoelectric ceramic composition with the addition of Co element to the NBT material, not only the production rate of the impurity BiT phase decreases but also the piezoelectric distortion constant of the piezoelectric ceramic composition increases due to the occurrence of a distortion in the crystal structure of the NBT material.

In the case of forming the piezoelectric ceramic composition only from the bismuth layer-structured ferroelectric NBT compound with no Ln element, i.e., in the case where the atomic ratio $Ln/(Na+Bi+Ln)$ is zero, the piezoelectric ceramic composition is unlikely to be polarized because of its high coercive field. This results in low mechanical quality factor of the piezoelectric ceramic composition. As the content ratio of Ln in the bismuth layer-structured ferroelectric NBT compound increases, the piezoelectric ceramic composition decreases in coercive field and allows the occurrence of a distortion in the crystal structure of the NBT compound. When the atomic ratio $Ln/(Na+Bi+Ln)$ exceeds 0.04, however, the crystal structure of the NBT compound becomes unstable so that the piezoelectric distortion constant of the piezoelectric ceramic composition decreases to be lower than 20 pC/N. The piezoelectric ceramic composition becomes also difficult to sinter due to deterioration in sintering ability. Herein, the piezoelectric constant of the piezoelectric ceramic composition is about 13 pC/N when the piezoelectric ceramic composition is formed only of the NBT compound.

Accordingly, the piezoelectric ceramic compositions according to the first and second embodiments of the present invention (hereinafter just referred to as the piezoelectric ceramic compositions of the present invention) are controlled in such a manner that the atomic ratio of the Na, Bi and Ln elements falls within the range of $0<Ln/(Na+Bi+Ln)\leq0.04$ in order to attain a high piezoelectric constant and high mechanical quality factor. It is preferable that the atomic ratio of the Na, Bi and Ln elements falls within the range of $0<Ln/(Na+Bi+Ln)\leq0.01$ in order to attain a higher piezoelectric distortion constant than that of the piezoelectric ceramic composition formed with the addition of the Co element to the NBT material.

It is preferable that each of the piezoelectric ceramic compositions of the present invention contains at least one of La, Ce, Pr, Nd and Yb as Ln (lanthanoide). The addition of at least one of La, Ce, Pr, Nd and Yb rather than other Ln elements leads to further improvement in mechanical quality factor. It is more preferable that each of the piezoelectric ceramic compositions of the present invention contains La as Ln for further improvement in mechanical quality factor.

Furthermore, it is preferable that each of the piezoelectric ceramic compositions of the present invention is substantially free of an element of group 2 of the periodic table (i.e. alkaline-earth metal element). When the piezoelectric ceramic composition contains an element of group 2, it is likely that the degree of deterioration of the piezoelectric distortion constant of the piezoelectric ceramic composition under high-temperature conditions will become increased. In other words, the deterioration of the piezoelectric distortion constant of the piezoelectric ceramic composition under high-temperature conditions can be limited to a low degree when the piezoelectric ceramic composition is substantially free of the element of group 2. It is noted that, in the present specification, the element of group 2 is undetectable by X-ray fluorescence analysis (XRF) when the piezoelectric ceramic composition is substantially free of the element of group 2.

The present invention also provides a piezoelectric device that has a plurality of electrodes of different polarities arranged on either of the above piezoelectric ceramic compositions of the present invention. As one example of the piezoelectric device, a disk-shaped piezoelectric device 200 is shown in FIG. 1. The piezoelectric device 200 has a disk-shaped body 100 (sintered body) of the piezoelectric ceramic composition and conductor layers 301 and 302 (as positive and negative electrodes) formed by applying and baking a conductive paste onto both sides of the piezoelectric ceramic composition body 100.

It can be judged whether the piezoelectric ceramic composition falls within the above-specified composition range by composition analysis such as ICP emission analysis or X-ray fluorescence analysis. The X-ray fluorescence analysis of the piezoelectric ceramic composition is carried out by e.g. forming a sintered body of the piezoelectric ceramic composition, analyzing the sintered body with an X-ray fluorescence spectroscope and determining a content ratio between metal constituent elements Na, Bi, (Ti,) Co and Ln of the piezoelectric ceramic composition to check whether the atomic ratio of the Na, Co and Ln elements falls within the range of $0<Ln/(Na+Bi+Ln)\leq0.04$. The ICP emission analysis of the piezoelectric ceramic composition is carried out by e.g. subjecting the piezoelectric ceramic composition to high-pressure sulfuric acid decomposition and analyzing the resulting decomposition product with an ICP emission spectroscope. It is herein noted that, when the bismuth layer-structured compound is the main component of the piezoelectric ceramic composition, the bismuth layer-structured compound is contained in the largest amount in the piezoelectric ceramic composition. The bismuth layer-structured compound can be thus judged as the main component when the constituent elements of the bismuth layer-structured compound are observed in the highest concentrations by the X-ray fluorescence analysis.

Next, explanations will be given on production methods of the piezoelectric ceramic compositions and the piezoelectric device of the present invention.

First, powders of sodium carbonate, bismuth oxide, titanium oxide, cobalt oxide and lanthanoide oxide (lanthanum oxide, cerium oxide, praseodymium oxide, neodymium oxide, ytterbium oxide etc.) are prepared as raw materials for metal constituent elements Na, Bi, Ti, Co and Ln (lanthanoide) of the bismuth layer-structured ferroelectric NBT compound. The raw powder materials are not necessarily prepared in the above forms and can alternatively be prepared in any other forms such as oxides, carbonates and hydrogen carbonates. The raw powder materials used are those containing substantially no elements of group 2 as impurities.

The raw powder materials are weighed out in such a manner that the piezoelectric ceramic composition satisfies, as a final product, the composition range of the present invention, added to a dispersant such as ethanol, and then, subjected to wet blending and pulverization by e.g. a ball mill. The thus-obtained slurry is dried to yield a raw powder mixture.

The raw powder mixture is calcinated e.g. in the air at 600 to 1100° C. for 10 to 300 minutes. The calcinated powder mixture is blended with an organic binder such as polyvinyl alcohol or polyvinyl butyral and a dispersant such as alcohol or ether and subjected to wet pulverization by e.g. a ball mill. The thus-obtained slurry is dried to yield a granulated powder material.

The granulated powder material is molded into a body of desired shape. There is no particular restriction on the shape of the molded body. The molded body can be of appropriately selected shape such as disk shape as needed. This molding process is preferably conducted by e.g. uniaxial molding at about 30 MPa, followed by cold isostatical press (CIP) at about 150 MPa. The resulting molded body is sintered e.g. at 1050 to 1250° C. for 1 to 10 hours.

Positive and negative electrodes are formed on the thus-obtained sintered body by, e.g. when the sintered body is of disk shape, subjecting opposite main surfaces of the sintered body to surface grinding, applying a conductive paste to the main surfaces of the sintered body by screen printing etc. and baking the applied conductive paste layers as appropriate.

As the conductive paste, there can be used those containing a conductive component, a glass frit and an organic medium. Examples of the conductive component are powders of noble metals such as silver, gold, palladium and platinum and alloys thereof and mixtures of two or more of the noble metal powders. In addition to these noble metal powders, there can be used powders of metals such as copper and nickel and alloys thereof and mixed powders thereof. Examples of the glass frit are those containing $SiO_2$, $Al_2O_3$, ZnO and $TiO_2$. Examples of the organic medium are those commonly used for this kind of paste, such as alcohols and ethers.

The sintered body on which the electrodes have been formed is subsequently polarized by the application of a direct-current voltage of about 3 to 20 kV/mm for 10 to 100 minutes in an insulating oil such as silicone oil at room temperature to about 200° C. With this, the piezoelectric ceramic composition is completed. The piezoelectric ceramic composition can be used by leaving the electrodes thereon or by removing the electrodes from the surfaces thereof.

As described above, the piezoelectric ceramic composition of the present invention contains the bismuth layer-structured compound (notably, bismuth layer-structured ferroelectric compound $Na_{0.5}Bi_{4.5}Ti_4O_{15}$ (NBT)), which is one kind lead-free piezoelectric ceramic material that has less environmental effects and high heat resistance but tends to show a relatively low piezoelectric distortion constant and mechanical quality factor, as the main component. The piezoelectric ceramic composition of the present invention is however able to attain a high piezoelectric distortion constant and high mechanical quality factor, while maintaining high heat resistance, even with no crystal orientation by the addition of Co and Ln (lanthanoide). This makes it possible to impart high heat resistance and good piezoelectric properties to the piezoelectric ceramic composition.

The piezoelectric ceramic compositions of such high heat resistance and good piezoelectric properties are suitably usable for various piezoelectric devices such as resonators, piezoelectric vibrators, actuators, combustion pressure sensors, knocking sensors, ultrasonic motors and piezoelectric gyro sensors.

The present invention will be described in more detail by reference to the following examples. It should be however noted that the following examples are only illustrative and not intended to limit the invention thereto.

Experiment 1

Using raw powders of sodium carbonate ($Na_2CO_3$), bismuth oxide ($Bi_2O_3$), titanium oxide ($TiO_2$), cobalt oxide (CoO) and lanthanoide oxide (lanthanum oxide ($La_2O_3$), cerium oxide ($Ce_2O_3$), praseodymium oxide ($Pr_2O_3$), neodymium oxide ($Nd_2O_3$), ytterbium oxide ($Yb_2O_3$)), various raw powder mixtures were prepared. In each of Examples, the raw powders were weighed out in such a manner as to form a piezoelectric ceramic composition of 0.967 $(Bi_{0.5}Na_{0.48}Bi_4Ti_4O_{15})$–0.033CoO where 0<Ln/(Na+Bi+Ln)≦0.04 as a final product. In Comparative Examples, the raw materials were weighed out in such a manner as to form four compositions as follows.

(1) $Bi_{0.5}Na_{0.5}Bi_4Ti_4O_{15}$
(2) $0.967(Bi_{0.5}Na_{0.48}Bi_4Ti_4O_{15})$–0.033CoO
(3) $Bi_{0.5}Na_{0.48}Bi_4Ti_4O_{15}$ where La/(Na+Bi+La)=0.002
(4) $Bi_{0.5}Na_{0.48}Bi_4Ti_4O_{15}$ where La/(Na+Bi+La)=0.04

Each of the raw powder mixtures was blended with ethanol and subjected to wet pulverization by a ball mill for 15 hours. The resulting slurry was put in a vessel to heat in hot water and dried to yield a raw mixed powder. The pulverized raw material was calcinated at 800° C. for 120 minutes, blended with an organic binder and ethanol and subjected to wet pulverization by a ball mill for 15 hours. The thus-obtained slurry was put in a vessel to heat in hot water and dried to yield a granulated powder material.

The granulated powder material was molded into a disk shape of 20 mm in diameter and 3 mm in thickness by uniaxial molding at 30 MPa. The disk-shaped molded body was subjected to cold isostatical press (CIP) at 150 MPa and then sintered at 1150° C. for 120 minutes.

Subsequently, opposite main surfaces of the sintered body were subjected to surface grinding. A silver paste of a glass frit containing $SiO_2$, $Al_2O_3$, ZnO and $TiO_2$, a silver powder and butylcarbitol acetate as an organic medium was applied to the main surfaces of the sintered body and baked at 700° C. for 20 minutes, thereby producing a disk-shaped device in which silver electrodes were formed on the disc-shaped ceramic body. The disk-shaped device was polarized by the application of a direct-current voltage of 9 kV/mm for 30 minutes in an insulating oil at 150° C. In this way, the piezoelectric ceramic devices (piezoelectric ceramic compositions) of Sample Nos. 1 to 14 were provided with the silver electrodes.

The piezoelectric distortion constant (d33) and mechanical quality factor (Qm) of the piezoelectric device was measured according to EMAS-6100 using an impedance analyzer (available as Model "4194A" from Hewlett-Packard Co.) under the conditions that the piezoelectric device was placed still in a constant temperature bath of 20° C.

For confirmation of the composition range and crystal phase of the piezoelectric ceramic composition, the same sintered bodies as those used for production of the piezoelectric devices were prepared and subjected to X-ray fluorescence analysis as well as crystal phase identification by X-ray diffraction. The X-ray fluorescence analysis was conducted using "ZSX100e" (trade name available from Rigaku Co.). The X-ray diffraction observation was conducted using "RU-200T" (trade name available from Rigaku Co.).

Figure 2A:
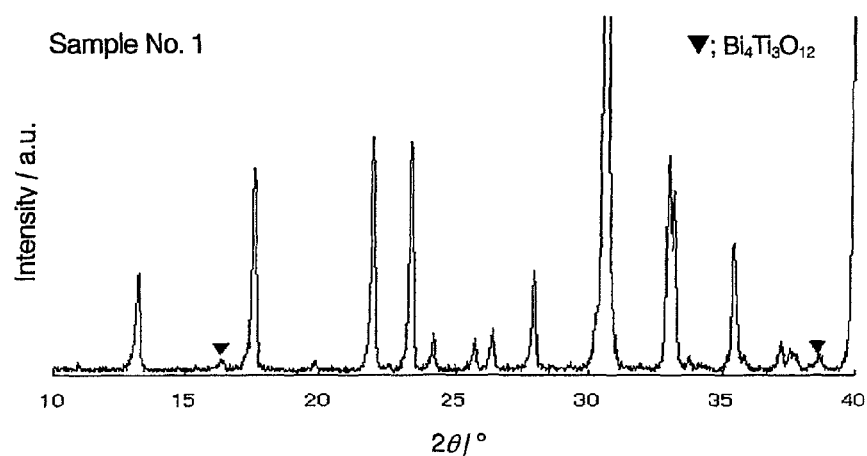
FIG. 2A is a chart diagram showing a result of X-ray diffraction observation of a piezoelectric ceramic composition of Comparative Example.
Figure 2B:
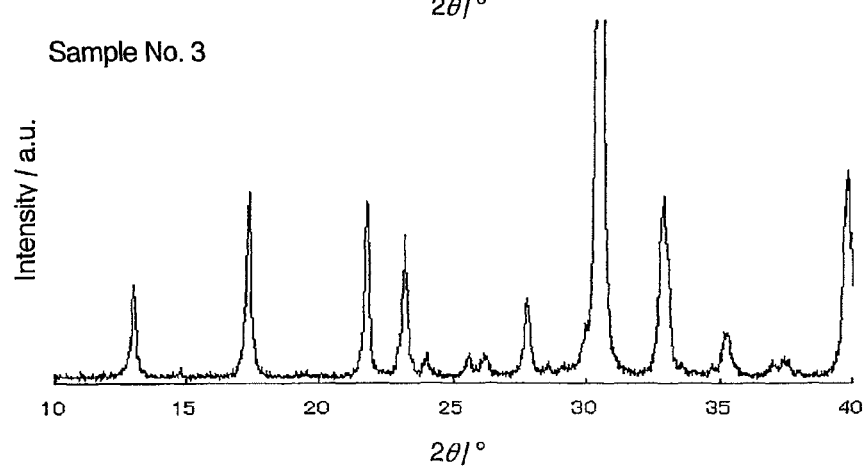
FIG. 2B is a chart diagram showing a result of X-ray diffraction observation of a piezoelectric ceramic composition of Example.

FIG. 2A AND 2B show chart diagrams showing the results of X-ray diffraction observations of Sample Nos. 1 and 3. TABLE 1 shows the results of X-ray fluorescence analysis (atomic ratio) of the piezoelectric ceramic compositions and the piezoelectric distortion constant (d33) and mechanical quality factor (Qm) of the piezoelectric devices. Further, TABLE 2 shows the coercive field values of Sample Nos. 2, 3, 7, 9, 10 and 12.

TABLE 1

| Sample No. | Composition | Ln element | Ln/(Ln + Na + Bi) | Qm | d33 (pC/N) |
|---|---|---|---|---|---|
| 1* | NBT | — | 0 | 1000 | 12.9 |
| 2* | NBT-Co | — | 0 | 1500 | 30.0 |
| 3 | NBT-Co-Ln | La | 0.01 | 7000 | 32.1 |
| 4 | NBT-Co-Ln | La | 0.02 | 4700 | 27.3 |
| 5 | NBT-Co-Ln | La | 0.03 | 8000 | 23.0 |
| 6 | NBT-Co-Ln | La | 0.04 | 6000 | 22.0 |
| 7 | NBT-Co-Ln | Ce | 0.01 | 4600 | 34.5 |
| 8 | NBT-Co-Ln | Ce | 0.02 | 4000 | 27.7 |
| 9 | NBT-Co-Ln | Pr | 0.01 | 4200 | 32.0 |
| 10 | NBT-Co-Ln | Nd | 0.01 | 2600 | 31.5 |
| 11 | NBT-Co-Ln | Nd | 0.02 | 4300 | 27.2 |
| 12 | NBT-Co-Ln | Yb | 0.01 | 4000 | 31.3 |
| 13* | NBT-Ln | La | 0.002 | 2000 | 13.0 |
| 14* | NBT-Ln | La | 0.04 | 3000 | 15.0 |

*out of the scope of the present invention

TABLE 2

| Sample No. | Ln element | Ln/(Ln + Na + Bi) | Qm | Coercive field (kV/mm) |
|---|---|---|---|---|
| 2* | — | 0 | 1500 | 5.5 |
| 3 | La | 0.01 | 7000 | 4.5 |
| 7 | Ce | 0.01 | 4600 | 4.5 |
| 9 | Pr | 0.01 | 4200 | 4.2 |
| 10 | Nd | 0.01 | 2600 | 3.8 |
| 12 | Yb | 0.01 | 4000 | 4.0 |

*out of the scope of the present invention

As seen in the X-ray diffraction observation results of FIG. 2A AND 2B, the bismuth layer-structured ferroelectric NBT compound was obtained in both of Sample No. 1 (Comparative Example) and Sample No. 3 (Comparative Example). It was confirmed by X-ray diffraction observations that the NBT compound was also obtained in the other samples. It was confirmed by additional X-ray diffraction observations that each of the piezoelectric ceramic compositions of Sample Nos. 1 to 14 had no crystal orientation.

However, BiT impurity phases occurred in the Co-free piezoelectric ceramic compositions of Sample Nos. 1, 13 and 14 (Comparative Examples) as seen in the X-ray diffraction observation result of FIG. 2A. Further, the Co-free piezoelectric ceramic compositions of Sample Nos. 1, 13 and 14 had a piezoelectric distortion constant of 15 (pC/N) or lower as indicated in TABLE 1. On the other hand, the occurrences of BiT impurity phases were inhibited in the Co-containing piezoelectric ceramic compositions of Sample No. 2 (Comparative Example) and of Sample Nos. 3 to 12 (Examples); and the Co-containing piezoelectric ceramic compositions of Sample Nos. 2 to 12 had a piezoelectric distortion constant of 20 (pC/N) or higher as indicated in FIG. 2B and TABLE 1.

As indicated in TABLE 1, the Ln-containing piezoelectric ceramic compositions of Sample Nos. 3 to 12 (Examples) and Sample Nos. 13 and 14 (Comparative Examples) had a mechanical quality factor of 2000 or higher. In addition, the coercive field of the piezoelectric ceramic composition was reduced by the addition of Ln as seen in TABLE 2. It is herein assumed that the mechanical quality factor was increased as the coercive field was decreased to allow sufficient polarization of the piezoelectric ceramic composition in Sample Nos. 3 to 12 (Examples) and Sample Nos. 13 and 14 (Comparative Examples).

To sum up, the piezoelectric ceramic compositions of Sample Nos. 3 to 12, which fall within the scope of the present invention, had good piezoelectric properties such as piezoelectric distortion constant of 20 (pC/N) or higher and mechanical quality factor of 2000 or higher. In particular, the piezoelectric distortion constant was higher in Sample Nos. 3, 7, 9, 10 and 12 where the atomic ratio of the Na, Bi and Ln elements was in the range of $0<Ln/(Na+Bi+Ln)\leq0.01$ than in Sample No. 2 where only the Co element was added. It is assumed that the piezoelectric distortion constant was increased as the occurrence of impurity phase (BiT) was limited to increase the production rate of the NBT compound by the addition of Co and, at the same time, distortion occurred in the crystal structure of the NBT compound by the addition of Ln. Moreover, the mechanical quality factor was higher in Sample No. 3 where the La element was added as Ln to the piezoelectric ceramic composition than in Sample Nos. 7, 9, 10 and 12 where the other Ln element was added at the same atomic ratio to the piezoelectric ceramic composition.

The piezoelectric distortion constant and mechanical quality factor of Sample Nos. 3 to 12 were measured after heat treatment at 600° C. for 1 hour in order to examine the effect of the heat treatment on the piezoelectric distortion constant and mechanical quality factor. Each of Sample Nos. 3 to 12 had little change in piezoelectric distortion constant before and after the heat treatment. Namely, the high heat resistance of the NBT compound was maintained in the samples of the piezoelectric ceramic composition and piezoelectric device of the present invention.

It has been shown by the above results that it is possible to combine a high piezoelectric distortion constant and high mechanical quality factor when the predetermined amount of Co and Ln (lanthanoide) are added as essential components to the bismuth layer-structured ferroelectric NBT material.

Experiment 2

The piezoelectric device (piezoelectric ceramic composition) of Sample No. 3 of Experiment 1 and piezoelectric devices (piezoelectric ceramic compositions) of Sample Nos. 15 and 16 corresponding to those in which group 2 elements of Ba and Sr were added to the composition of Sample No. 3 were tested for the Curie Temperature (Tc) and the degree of deterioration of the piezoelectric distortion constant under the heat treatment at 600° C. for 1 hour.

More specifically, the raw powders used for Sample No. 3 were the same as those of Experiment 1. In Sample Nos. 15 and 16, the raw materials were weighed out in such a manner as to form the following composition as final products.
(1) $0.967(Bi_{0.5}Na_{0.48})Bi_4Ti_4O_{15}$–$0.033CoO$ where La/(Na+Bi+La)=0.01 and $(Bi_{0.5}Na_{0.48})$ substituted by 25 mol % Ba
(2) $0.967(Bi_{0.5}Na_{0.48})Bi_4Ti_4O_{15}$–$0.033CoO$ where La/(Na+Bi+La)=0.01 and $(Bi_{0.5}Na_{0.48})$ substituted by 25 mol % Sr
Using these raw powder mixtures, the piezoelectric devices were produced in the same manner as in Experiment 1.

The Curie temperature Tc of the piezoelectric devices was measured using an impedance analyzer (available as Model "4194A" from Hewlett-Packard Co.) and an electric furnace. The initial piezoelectric distortion constant of the piezoelectric devices was measured in the same manner as in Experiment 1. Each of the samples was subjected to heat test in the air at 600° C. for 1 hour. After that, the piezoelectric distortion constant of the piezoelectric devices was again measured in the same manner under the conditions that the piezoelectric devices were each placed still in a constant temperature bath of 20° C. The measurement results are indicated in TABLE 3. Further, the piezoelectric ceramic compositions of Samples No. 15 and 16 were analyzed by X-ray fluorescence analysis and found to contain Ba and Sr components, respectively.

TABLE 3

| Sample No. | Composition | Ln element | Ln/(Ln + Na + Bi) | Group 2 element | Tc (° C.) | d33 (pC/N) before heat test | d33 (pC/N) after heat test |
|---|---|---|---|---|---|---|---|
| 3 | NBT-Co-Ln | La | 0.01 | — | 680 | 32.1 | 29.5 |
| 15* | | | | Ba | 580 | 19.1 | 0 |
| 16* | | | | Sr | 570 | 22.0 | 0 |

*out of the scope of the present invention

As indicated in TABLE 3, Tc was at a low level of less than less than 600° C. in Sample Nos. 15 and 16 (Comparative Examples) where the group 2 elements Ba and Sr were added. Under the heat test, the piezoelectric distortion constant of the piezoelectric ceramic composition (piezoelectric device) of Sample No. 3 (Example) was slightly deteriorated within the range that would not cause any problem in practical use. By contrast, the piezoelectric distortion constant of Sample Nos. 15 and 16 (Comparative Examples) was significantly deteriorated under the heat test.

It has been shown by the above results that it is possible to limit the degree of deterioration of the piezoelectric distortion constant to a low level when the predetermined amounts of Co and Ln (lanthanoide) are added as essential components to the bismuth layer-structured ferroelectric NBT material with substantially no element of group 2.

Although the present invention has been described with reference to the above specific embodiments, the invention is not limited to these exemplary embodiments. Various modifications and variations of the embodiments described above will occur to those skilled in the art in light of the above teachings. For example, the piezoelectric ceramic composition of the present invention may contain a trace amount of impurity as long as the impurity does not decrease the piezoelectric distortion constant and mechanical quality factor of the piezoelectric ceramic composition. The piezoelectric device is not limited to the above form in which a plurality of electrodes are arranged on both sides of the disk-shaped body (sintered body) of the piezoelectric ceramic composition, but can be produced e.g. by forming a square body of the piezoelectric ceramic composition and arranging a plurality of electrodes on the square-shaped piezoelectric ceramic composition body or by arranging a plurality of electrodes of different polarities on one side of the piezoelectric ceramic composition.

The invention claimed is:

1. A piezoelectric ceramic composition comprising a bismuth layer-structured compound, which contains Na, Bi, Co and Ln (lanthanoide), as a main component, wherein the piezoelectric ceramic composition has an atomic ratio of $0<Ln/(Na+Bi+Ln)\leqq0.04$ and is substantially free of an element of group 2 of the periodic table; and wherein the bismuth layer-structured compound has no crystal orientation.

2. A piezoelectric ceramic composition according to claim 1, wherein said Ln is at least one of La, Ce, Pr, Nd and Yb.

3. A piezoelectric device, comprising:
a piezoelectric ceramic composition according to claim 1; and
a plurality of electrodes of different polarities arranged on the piezoelectric ceramic composition.

4. A piezoelectric device, comprising:
a piezoelectric ceramic composition according to claim 2; and
a plurality of electrodes of different polarities arranged on the piezoelectric ceramic composition.

* * * * *